(12) United States Patent
Chen et al.

(10) Patent No.: US 6,613,592 B1
(45) Date of Patent: Sep. 2, 2003

(54) IMD OXIDE CRACK MONITOR PATTERN AND DESIGN RULE

(75) Inventors: Shin-Kai Chen, Taipei (TW); Chun-Chen Yeh, Taipei (TW); Jyh-Feng Lin, Hua-Lien (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/132,358

(22) Filed: Apr. 25, 2002

(51) Int. Cl.[7] .......................... H01L 21/00; H01L 21/66; H01L 21/302; G01R 31/26
(52) U.S. Cl. .................... 438/14; 438/10; 438/18; 438/781
(58) Field of Search .................. 438/14, 10, 18, 438/781, 780, 789

(56) References Cited

U.S. PATENT DOCUMENTS

| | | | |
|---|---|---|---|
| 5,266,525 A | 11/1993 | Morozumi | 437/195 |
| 5,567,655 A | 10/1996 | Rostoker et al. | 437/209 |
| 5,637,186 A | 6/1997 | Liu et al. | 438/14 |
| 5,788,767 A | 8/1998 | Ko et al. | 117/92 |
| 5,998,226 A | 12/1999 | Chan | 438/10 |
| 6,028,324 A * | 2/2000 | Su et al. | 257/48 |
| 6,046,102 A | 4/2000 | Bothra et al. | 438/624 |
| 6,093,620 A | 7/2000 | Peltzer | 438/416 |
| 6,191,036 B1 | 2/2001 | Yu et al. | 438/689 |
| 6,246,075 B1 * | 6/2001 | Su et al. | 257/48 |
| 6,248,661 B1 | 6/2001 | Chien et al. | 438/632 |
| 6,291,254 B1 | 9/2001 | Chou et al. | 438/18 |
| 6,479,404 B1 * | 11/2002 | Steigerwald et al. | 438/781 |

* cited by examiner

*Primary Examiner*—John F. Niebling
*Assistant Examiner*—Walter L. Lindsay, Jr.
(74) *Attorney, Agent, or Firm*—George O. Saile; Stephen B. Ackerman

(57) ABSTRACT

A new method is provided to monitor and to prevent IMD oxide irregularities such as IMD oxide cracks. A monitoring pattern is inserted in the test line of the fabrication substrate to monitor the strength of the created layer of IMD oxide. Variations in the characteristics of the created layer of IMD oxide can in this manner be detected. In addition, design rules are provided that are aimed at avoiding layers of IMD oxide that have proven or are known to be particularly prone to the occurrence of IMD oxide cracks.

30 Claims, 5 Drawing Sheets

IMD OXIDE CRACK MONITOR PATTERN AND DESIGN RULE

BACKGROUND OF THE INVENTION

(1) Field of the Invention

The invention relates to the fabrication of integrated circuit devices, and more particularly, to a method to eliminate a layout-dependent problem of cracks occurring in layers of Inter Metal Dielectric (IMD) oxide.

(2) Description of the Prior Art

The creation of semiconductor devices requires the creation of multiple device elements that must are interconnected in order to form a functional device. Where device elements are required to be electrically isolated from each other, this isolation is accomplished by providing separating layers of semiconductor material between these elements. These separating layers not only perform the function of electrically isolating active elements of semiconductor devices from each other but additionally provide sealing the devices from outside influences and conditions while the separating layers are typically used to provide support for overlying layers of patterned semiconductor material. Conventionally, an upper layer of passivation material is deposited over the surface of a completed device, providing protection for the multiple underlying devices against environmental effects such as moisture or impurities in addition to providing protection during further processing of the device such as packaging the device.

The application of layers of Inter Metal Dielectric (IMD) and Intra Level Dielectric (ILD) is well known in the art. In the field of high density interconnect technology, many integrated circuit chips are physically and electrically connected to a single substrate. To achieve a high wiring and packing density, it is necessary to fabricate a multilayer structure on the substrate to connect integrated circuits to one another. Typically, metal power and ground planes in the substrate are separated by layers of a dielectric. Embedded in other dielectric layers are metal conductor lines with vias holes providing electrical connections between signal lines or to the metal power and ground planes. To avoid problems of depth of focus and the like during the process of photolithography that is part of the creation of interconnect patterns, it is important to produce patterned layers that are substantially flat and smooth (i.e., planar) to serve as the base for the next layer. A non-flat surface results in photoresist thickness variations that require pattern or layer dependent processing conditions, greatly increasing the problem complexity and leading to line width variation and reduced yield.

Improved device performance is typically and by necessity obtained by continued reduction in device dimensions. It is therefore not uncommon to have devices, of for instance logic devices, that have device feature dimensions of sub-micron and deep sub-micron values, such as 0.25 $\mu$m and even down to 0.18 $\mu$m. For devices of such small dimensions, the creation of surrounding layers of dielectric presents a special challenge. The layer of dielectric correspondingly will be created having smaller dimensions since proximity of device features cannot be sacrificed due to the decrease in device feature dimensions. Device densities increase therefore with increasing device miniaturization. This results in creating patterns of strain in layers of dielectric, which have been known to cause fissures or cracks in the created layers of dielectric. These cracks will most naturally occur where the stress in the created layer of dielectric is highest, which is in corners or abrupt changes in the cross section of the created layer of dielectric.

The invention specifically addresses the occurrence of cracks in layers of IMD oxide where these layers are created as part of devices having deep-submicron dimensions. It has been found that IMD oxide defect is essentially layout-dependent and that this defect is therefore present at known locations within the deposited layer of IMD oxide. Creating layers of IMD oxide of higher deposition densities can reduce IMD oxide crack. Lacking thereby however is an effective quantitative method that can be applied to gain additional insight in predicting when and under which conditions of IMD oxide deposition flaws in the deposited layer of IMD oxide, such as cracks, are most likely to occur. The invention addresses this issue.

U.S. Pat. No. 6,093,620 (Peltzer) reveals an oxide crack problem.

U.S. Pat. No. 5,788,767 (Ko et al.) discloses a pinhole test for oxide cracks.

U.S. Pat. No. 6,046,102 (Bothra et al.) and U.S. Pat. No. 5,266,525 (Morozumi) are related patents showing aspects of IMD'S.

SUMMARY OF THE INVENTION

A principle objective of the invention is to remove the occurrence of irregularities such as cracks in a layer of IMD oxide that is created as part of the process of creating semiconductor devices having deep sub-micron device features.

Another objective of the invention is to provide a pattern in a layer of IMD oxide that monitors the occurrence of IMD oxide cracking.

Yet another objective of the invention is to provide design rules used for the creation of semiconductor devices that are aimed at preventing the occurrence of IMD oxide cracking.

In accordance with the objectives of the invention a new method is provided to monitor and to prevent IMD oxide irregularities such as IMD oxide cracks. A monitoring pattern is inserted in the test line of the fabrication substrate to monitor the strength of the created layer of IMD oxide. Variations in the characteristics of the created layer of IMD oxide can in this manner be detected. In addition, design rules are provided that are aimed at avoiding layers of IMD oxide that have proven or are known to be particularly prone to the occurrence of IMD oxide cracks.

DESCRIPTION OF THE PREFERRED EMBODIMENTS

Figure 1:
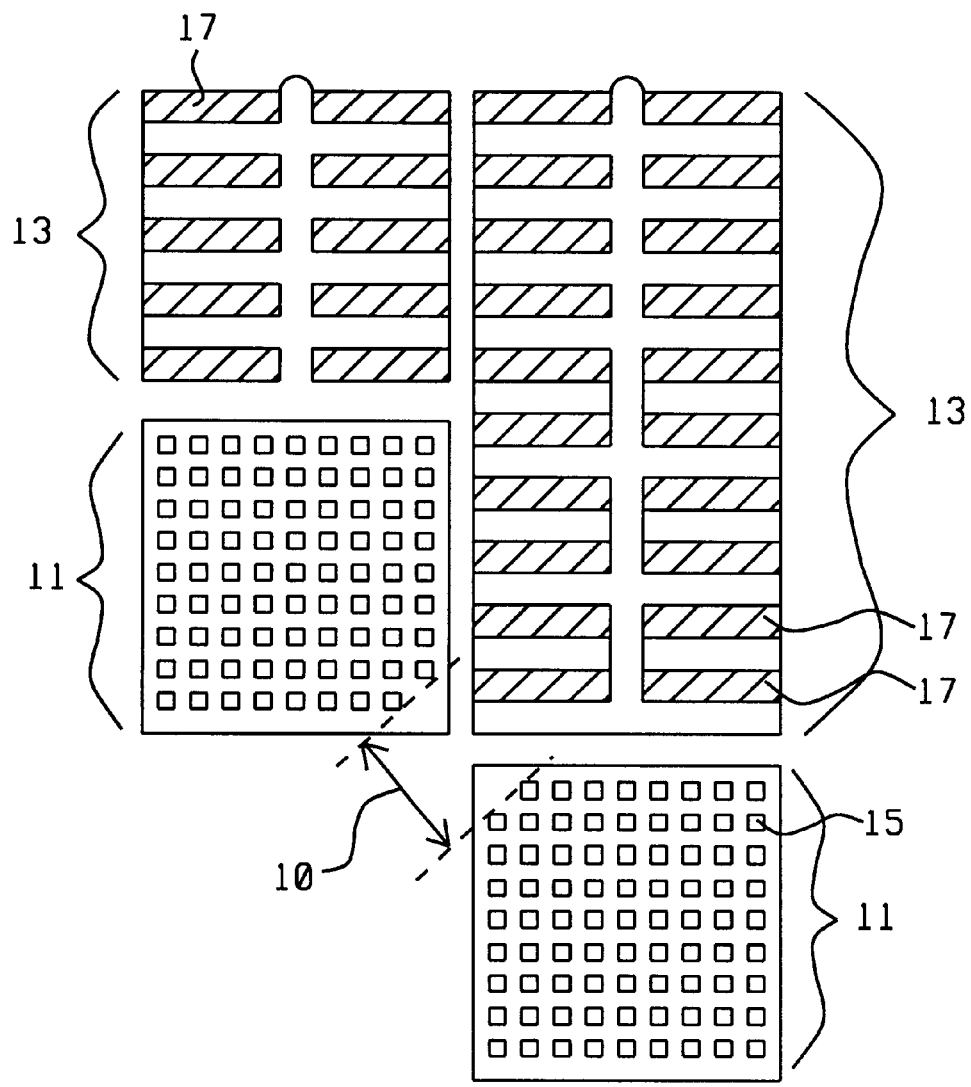
FIG. 1 shows a top view of a first group of via array to via array spacing.

The phenomenon of cracks occurring in a created and patterned layer of IMD oxide is a frequently observed problem for devices having deep sub-micron device features. The phenomenon has been observed as being highly design and layout dependent and can be readily identified at particular locations in particular layouts. Different processing conditions can be applied for the creation of the layer of IMD oxide, these different conditions can at times alleviate the problem by for instance creating a layer of IMD oxide of higher density. This approach however has not completely eliminated the problem, which is the reason that additional means must be made available to address this problem.

The invention teaches the means of:

providing an oxide check pattern that monitors the characteristics of the created layer of oxide; the check pattern can monitor the strength of the created layer of IMD oxide thereby monitoring the layer of IMD oxide for the occurrence of oxide crack, and providing a new design rules that are aimed at avoiding IMD oxide cracks; the design rules avoid critical layout configurations that are prone to the occurrence of oxide crack.

It is common practice in the creation of complex and dense semiconductor devices to create stacked via arrays that are closely spaced together. It has been found that IMD oxide cracks are most frequently occur where two arrays of stacked vias, containing a large number of stacked vias and having a relatively large dimension of the stacked via array, are closely spaced together. Points surrounding the stacked via arrays, that are adjacent and in close physical proximity, are the points where cracks in the IMD oxide are most frequently observed.

The basic cause of the above highlighted occurrence of IMD oxide cracks is that extremely high and localized tensile stress is introduced in a closely spaced layer of IMD oxide where this oxide comprises a large stacked array of vias. It is known that the compressive stress of a layer of IMD oxide can typically resist the tensile stress introduced in the layer of IMD oxide. In the applications and the design layouts that have been highlighted above however, the tensile stress becomes dominant and is no longer cancelled out by the compressive stress, resulting in cracks forming at points of high tensile stress in the layer of IMD oxide.

The factors that predominantly influence this formation of cracks in a layer of IMD oxide have been identified as follows:

1. the dimension of the stacked via array
2. the total number of vias within the stacked via array
3. the total number of layers of metal of the stacked via array, and
4. the spacing between the stacked via arrays.

Based on the above highlighted findings, a working model is provided that is aimed at eliminating cracks in a layer of IMD oxide. This working model implements the following rules:

1. smaller dimensions of the stacked via array so that it relatively "easier" to incorporate the stacked via array as part of the device
2. lower density of the vias that form the stacked via array
3. fewer layers of metal that are applied to form the stacked via array, and
4. larger spacing between adjacent stacked via arrays.

A number of experiments, four in total, have been designed to gain further insight into the problem under discussion in addition to gaining insight into guidelines that must be optimally followed in order to eliminate the problem. A total of four layouts of via arrays and surrounding metal have been designed, this essentially to provide for the best design rule that results in the elimination of IMD oxide cracks.

From these experiments it has been concluded that the most critical layout for oxide cracks is when 2 fully stacked via arrays are diagonally and adjacently positioned with respect to each other. Using this finding, the four test groups have been designed accordingly. A via mask and a metal mask have been used for the experiments.

The four groups of the experiment will be highlighted next.

1) Group 1: via array to via array spacing.

The objective of the test is to find the minimum spacing between 2 adjacent via arrays that will not cause cracks to appear in the layer of IMD oxide Method applied: remove the corner of each via array, a spacing 10, FIG. 1, is varied and adjusted from 10 $\mu$m to 20 $\mu$m to 35 $\mu$m and to 50 $\mu$m The metal width for metal lines 17 has been selected as being 50 $\mu$m, and The metal spacing between adjacent metal lines 17 has been selected as being 0.8 $\mu$m.

Further highlighted in the top view that is shown in FIG. 1 are surface areas 11, that comprise stacked vias 15, and surface areas 13, that comprise metal lines 17.

It is clear that vias 15 and metal lines 17 are formed in a layer of dielectric. This layer of dielectric preferably comprises oxide but can also comprise a low-k dielectric such as carbon doped silicates, spin-on low-k dielectric materials and polymeric materials. The polymeric materials can consist of polyimides and fluorinated polyimides and polysilsequioxane and benzocyclobutene (BCB) and parlene F and parlene N and amorphous polytetrafluorothylene.

2) Group 2: via hole to via hole spacing.

Figure 2:
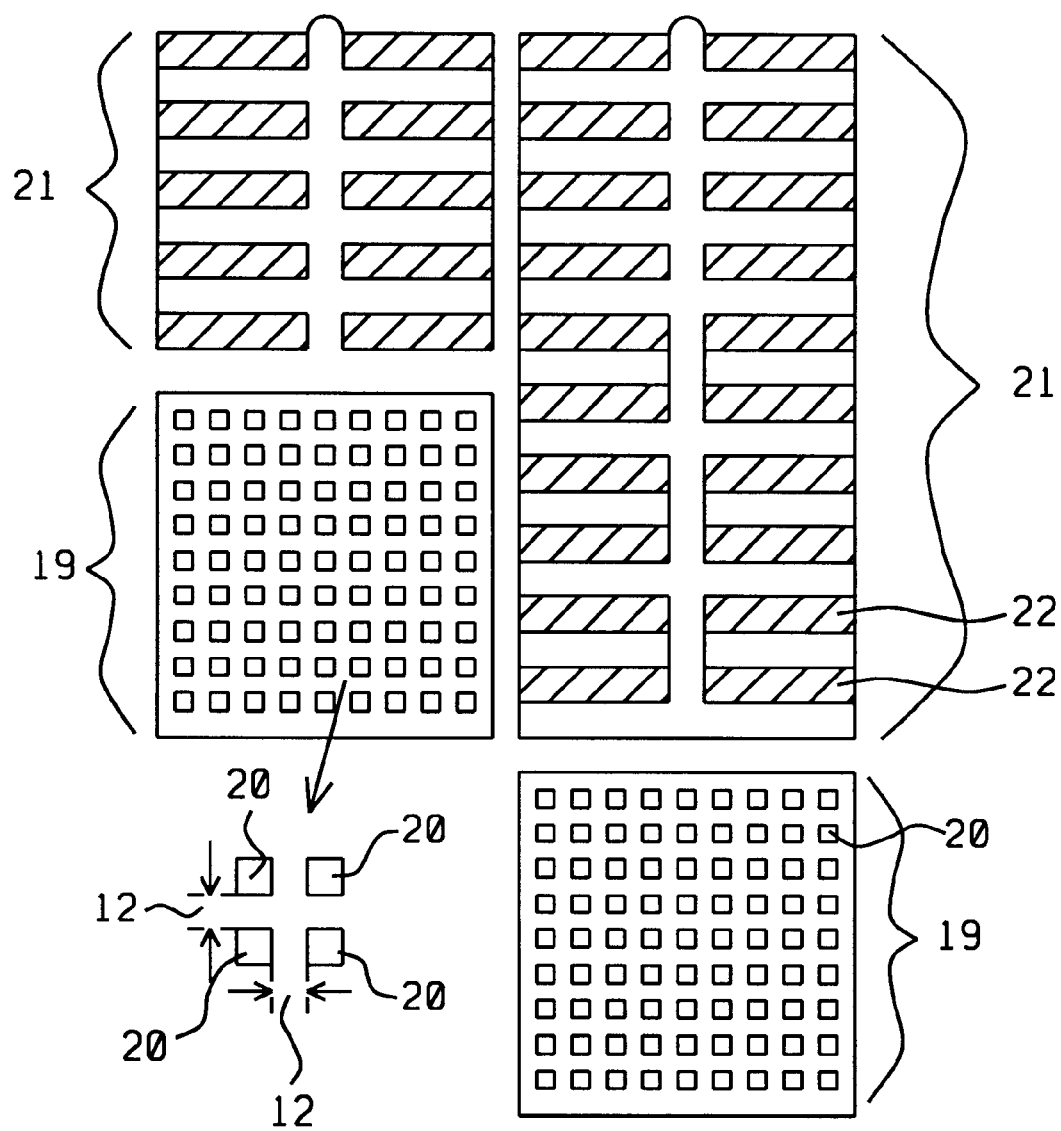
FIG. 2 shows a top view of a second group of via hole to via hole spacing.

The objective of the test is to find the minimum spacing between two adjacent via holes 20 within a stacked array 19 that will not cause cracks to appear in the layer of IMD oxide Method applied: keep the via array 19 in rectangular shape, a spacing 12, FIG. 2, between adjacent vias 20 is adjusted from 0.4 $\mu$m (minimum rule) to 0.7 $\mu$m (bond pad rule) to successively 0.9, 1,2, 1.5, 1.8, 2.0 and 3.0 $\mu$m The metal width has been selected as being 50 $\mu$m, and The metal spacing has been selected as being 0.8 $\mu$m.

Further highlighted in the top view that is shown in FIG. 2 are surface areas 19, that comprise stacked vias 20, and surface areas 21, that comprise metal lines 21.

3) Group 3: metal/via array size.

The objective of the test is to find the minimum array size for two adjacent via arrays that will not cause cracks.

Figure 3:
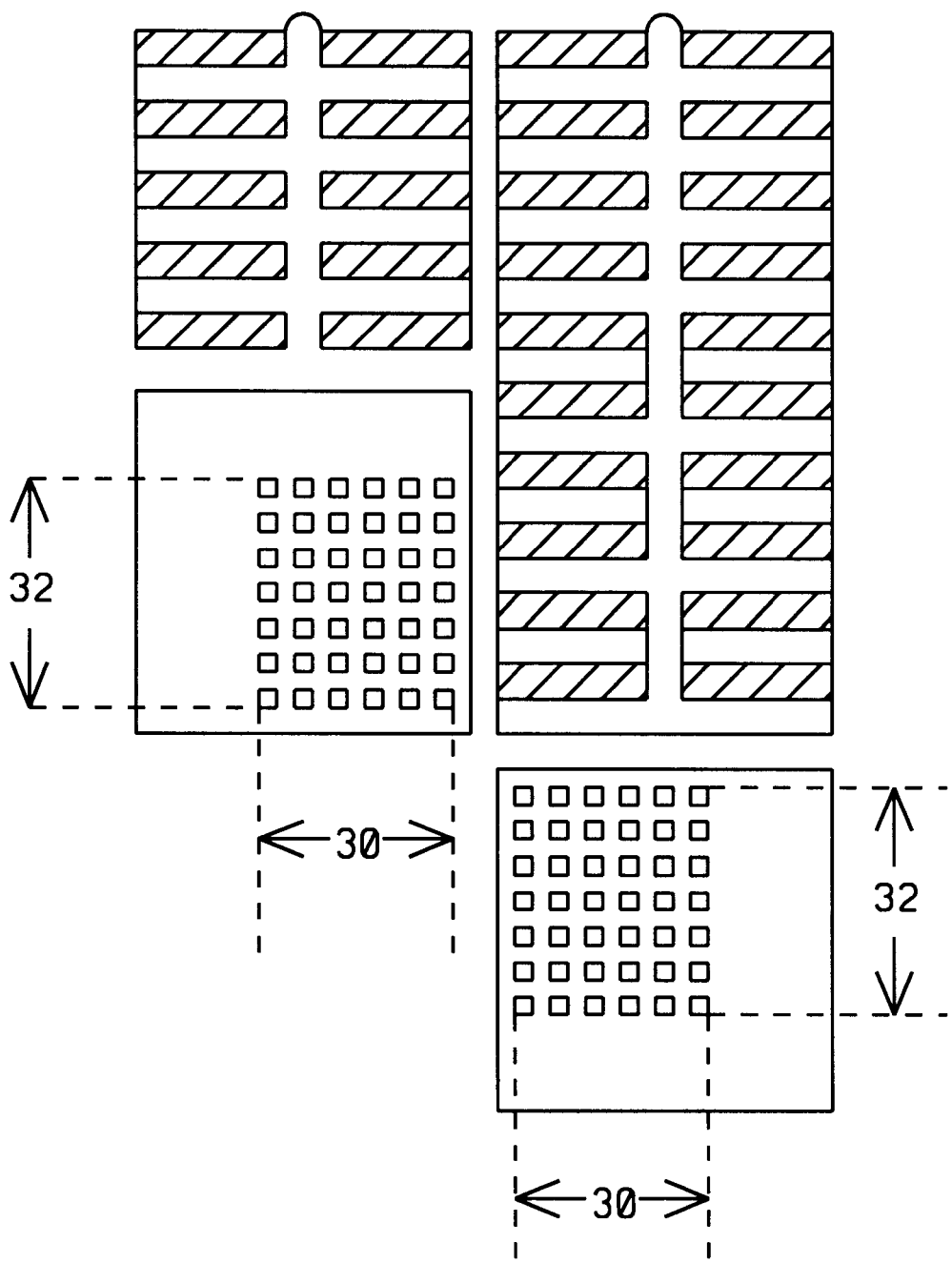
FIG. 3 shows a top view of a third group of metal to via array spacing.

Method applied: keep the via array in rectangular shape, a via spacing 30, FIG. 3, between adjacent vias is maintained as (minimum rule). The size of the vial array is changed by changing the length/width ratio 32/30, FIG. 3, of the via array. This ratio has been adjusted to 30 $\mu$m/40 $\mu$m, 30 $\mu$m/50 $\mu$m, 20 $\mu$m/50 $\mu$m, 10 $\mu$m/50 $\mu$m, 40 $\mu$m/40 $\mu$m, 30 $\mu$m/30 $\mu$m, 20 $\mu$m/20 $\mu$m and 10 $\mu$m/10 $\mu$m The metal width has been selected as being 50 $\mu$m, and The metal spacing has been selected as being 0.8 $\mu$m.

The via arrays and the regions where the metal lines have been created have not been highlighted in the top view that is shown in FIG. 3 since these elements are now familiar from the preceding FIGS. 1 and 2. The same approach has been used with respect to highlighting individual vias and metal lines.

4) Group 4: metal spacing.

The objective of the test is to verify the minimum metal spacing between two wide metal lines with stacked via arrays that will not cause cracks Method applied: increase the metal width of the test pattern in Group 2 above from 50 μm to 100 μm. Keep the via spacing as the minimum rule at 0.4 μm, change the metal spacing only. The metal spacing 40 has been adjusted successively to 0.8 μm, 1.0 μm, 2 μm, 3 μm, 4 μm, 5 μm, 6 μm, 8 μm, 10 μm and 15 μm The metal width has been selected as being 100 μm, and The metal spacing has been selected variable.

Figure 4:
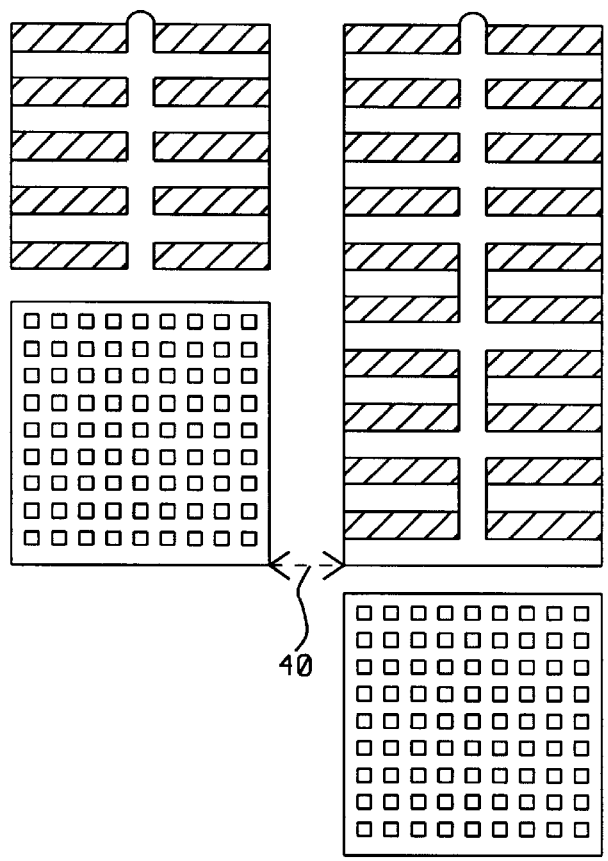
FIG. 4 shows a top view of a fourth group of metal spacing.

The via arrays and the regions where the metal lines have been created have not been highlighted in the top view that is shown in FIG. 4 since these elements are now familiar from the preceding FIGS. 1 and 2. The same approach has been used with respect to highlighting individual vias and metal lines.

The number of layers of via and metal layout that has been applied for the four groups of layout can further be adjusted, with additional layers of metal and vias applied in a stacked manner.

These modifications are made using two different approaches for the creation of the layer of IMD, a first approach using SACVD+PETEOS (which is the original approach), a second approach using a 5" layer of pre-heated HDP+PETEOS.

Further use is made of the insight that the more metal/via are stacked, the worse the phenomenon of oxide cracks become. For this reason, different layers of metal/vias have been designed in this experiment. One via mask and one metal mask have been used, these two masks have been repeatedly stacked in order to create fully stacked via arrays. A standard metal creation process has been used, which is a 4,0000 Angstrom thick layer of inter-metal and a 8,000 Angstrom thick layer of top metal.

These latter preparations are shown in Table I below, an "x" indicating in the column refers to a structure that has been created as highlighted above.

TABLE I

| | | wafer | | | | | | | | |
|---|---|---|---|---|---|---|---|---|---|---|
| | | #1 | #2 | #3 | #4 | #5 | #6 | #7 | #8 | #9 |
| IMD | SACVD + PETEOS | | | | | x | x | x | x | x |
| | HDP + PETEOS | x | x | x | x | | | | | |
| metal/ | 6/5 | x | | | | x | | | | |
| via | 5/4 | | x | | | | x | | | |
| layers | 4/3 | | | x | | | | x | | |
| | 3/2 | | | | x | | | | x | |
| | 2/1 | | | | | | | | | x |

Finally, the following Table II shows the results that have been obtained using the four previously highlighted groups of experiments that have been performed creating the structures that are highlighted in the above table I.

The following symbols are used in the above table:

1. an "O" indicates that all the dimensions of the group are free of cracks
2. an "X" indicates that all dimensions of the group suffer oxide crack
3. groups 1, 2 and 4 are all spacing items; the values filled in the columns represent the minimum spacing of oxide that is free of cracks, and
4. group 3 is the via array experiment; the numeric values filled in the columns for this group represent the maximum via array dimension that does not cause oxide cracks.

For purposes of further clarification of the preceding descriptions, it must be added that a standard 0.25 metal scheme has been used for these experiments, which uses 4,000 Angstrom layer of AlCu for the inter metal layers and 8,000 Angstrom layer of AlCu for the top layer of metal.

The above table is to be combined with the previously highlighted groupings of group #1 through group #4, by realizing that for each of the groups #1 through #4 metal and vias have been created in accordance with the above table. The above table indicates the various test substrates that have been used (wafer #1 through #9) and the type of metal/vias that has been created for each of theses test wafers. For instance, for test wafer #2, an IMD layer of 1) HDP deposited over a 5" surface area and having been preheated with 2) a layer of PETEOS have been created. For this test substrate #2 a total of 5 metal layers combined with 4 layers of stacked vias have been created. Where these layers apply to group #2, the metal/via pattern that is shown in FIG. 2 has been created.

Figure 5A:
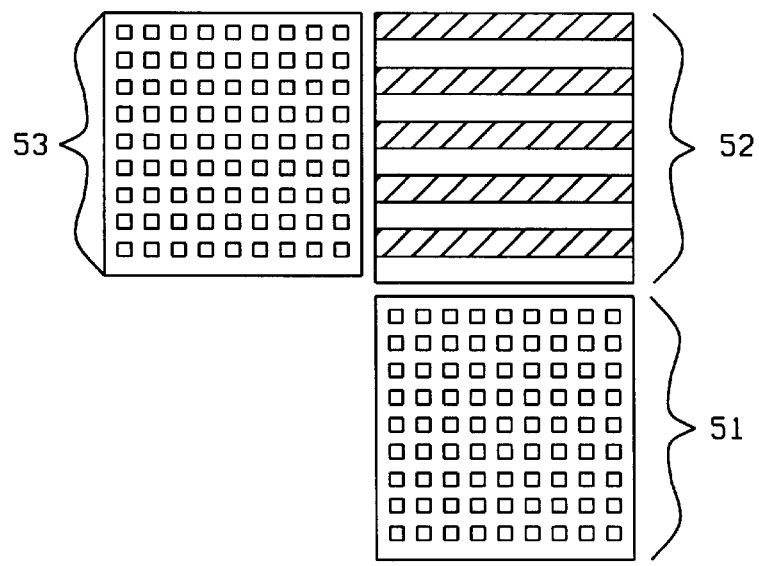
FIGS. 5a through 5c show a top view of the oxide crack check pattern.
Figure 5B:
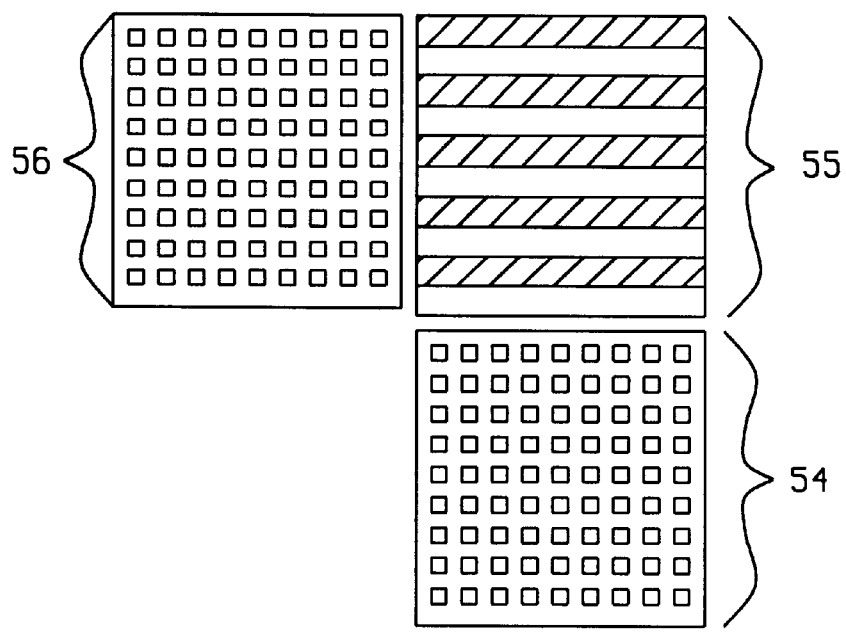
Figure 5C:
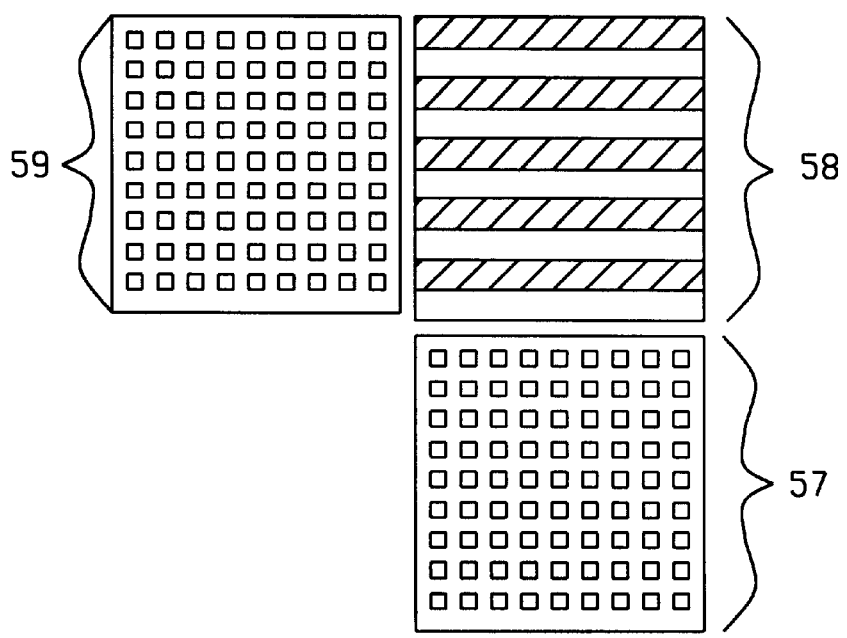

The above highlighted layout of group 3 has been selected for this purpose as the pattern for the evaluation of the IMD oxide crack occurrence. The pattern of the check pattern is shown in FIGS. 5a through 5c, different dimensions of the via array can be selected for implementation of the check pattern into the test line of the substrate. The check pattern is stacked through the layer of metal-1 and the via-1 to the top layer of metal. The metal spacing is kept as wide as the metal minimum rule as are the via spacings. By adding the check pattern to the test line, the oxide film condition can be monitored from which conclusions can be drawn relating to the behavior of the IMD oxide.

The top view that is shown in FIG. 5a represents a via array of 20×20 μm, FIG. 5b represents a via array of 10×10 μm and FIG. 5c represents a via array of 10×10 μm.

It is clear that vias and metal lines of the check pattern that are shown in top view in FIGS. 5a through 5c are formed in a layer of dielectric. This layer of dielectric preferably comprises oxide but can also comprise a low-k dielectric such as carbon doped silicates, spin-on low-k dielectric materials and polymeric materials. The polymeric materials can consist of polyimides and fluorinated polyimides and polysilsequioxane and benzocyclobutene (BCB) and parlene F and parlene N and amorphous polytetrafluorothylene.

From the above described experiments is can be concluded that the stacked via arrays cause IMD oxide cracks

TABLE II

| | wafer | | | | | | | | |
|---|---|---|---|---|---|---|---|---|---|
| | #1 | #2 | #3 | #4 | #5 | #6 | #7 | #8 | #9 |
| group #1 | 35 μm | O | O | O | X | X | 35 μm | O | O |
| group #2 | 0.7 μm | 0.7 μm | O | O | X | X | 1.5 μm | O | O |
| group #3 | 10 × 10 μm | 20 × 20 μm | O | O | X | X | 10 × 50 μm | O | O |
| group #4 | 3 μm | 3 μm | O | O | 3 μm | 3 μm | 1 μm | O | O | when the stacked arrays are located closely together. An IMD oxide crack check pattern, FIGS. 5a through 5c, has therefore been designed following this observation, the top view that are shown in FIGS. 5a through 5c are top view of the oxide crack check pattern of the invention. It will be recognized that the pattern that is shown in FIGS. 5a through 5c is the pattern that previously has been described under the description of Group #3.

FIG. 5a shows a 20×20 μm via array with highlighted areas:

51, a first stacked via array 52, metal lines adjacent to the stacked via array, and 53, a second stacked via array.

FIG. 5b shows a 10×10 μm via array with highlighted areas:

54, a first stacked via array 55, metal lines adjacent to the stacked via array, and 56, a second stacked via array.

FIG. 5c shows a 5×5 μm via array with highlighted areas:

57, a first stacked via array 58, metal lines adjacent to the stacked via array, and 59, a second stacked via array.

For the oxide crack check pattern, FIGS. 5a through 5c, the following rules can be summarized:

1. select a layout for the check pattern whereby the array pattern is rectangular in shape
2. change the via array size by changing the ratio of via array length to via array width
3. keep the via spacing in accordance with the via minimum rule
4. keep the metal spacing in accordance with the metal minimum rule
5. stack the test pattern from metal-1 through top metal, the number of vias in the stack of the oxide crack check pattern being equal to and determined by the design of the stacked via/layers of metal that are being monitored for oxide crack, and
6. place the oxide crack check pattern to a area in the perimeter of the surface that is being checked, preferably in the test-line of the substrate that is being monitored for oxide crack.

Using the results that have been obtained during the above highlighted experiments, design rules can be formulated that can be expected to prevent the occurrence of IMD oxide cracks. In the groups #1, #2 and #3 the dimensions of the via array of the test pattern is 50×50 μm. From this follows that the design rules and guidelines that are derived from the results obtained using groups 1, 2 and 3 are applied for via arrays that have a dimension of less than 50×50 μm. Standard 0.25 μm logic design uses a structure formed of 5 metal layers and 4 layers of stacked vias from which follows (see table I above) that the design rules and guidelines are based on the results that have been obtained using substrates #2 and #6. However, as can be seen from Table II, substrate #6 failed for al the patterns of groups 1 through 3. This implies that design rules and guidelines cannot be derived using the results of groups 1 though 3 since these results would not relate to all possible schemes of creating the layer of IMD. Therefore, guidelines can be derived only from the results of groups 1 through 3.

The following guidelines have been formulated for the prevention of IMD oxide cracks:

1. For group #1: the minimum space between two fully stacked via arrays must be larger than 10 μm
2. For group #2: in a fully stacked via array, the via-to-via spacing must be larger than 0.7 μm
3. For group #3: in a fully stacked via array (including metal and top metal) the via array dimension must be smaller than 20×20 μm, and
4. For group #4: the results obtained here are the most useful results. The IMD oxide crack disappeared when the metal spacing is larger than 3 μm, this independent of the IMD schemes. The test pattern dimension is 100×100 μm, which makes this more rigorous than the test pattern that is used for groups #1 through #3. The 3 μm structure is also acceptable for a 5 via/6 metal structure which means that this metal is safe to be applied for a standard 5 via/6 metal process. From this then follows the design rule that the space between two metal lines must be wider than 10 μm while a fully stacked via array must concurrently be provided.

The method of the invention of monitoring formation of oxide cracks in a layer of dielectric can be summarized as follows:

starting with a substrate, at least one layer of dielectric is deposited over the surface of the substrate at least one layer of via interconnects is created in the at least one layer of dielectric at least one layer of top metal is created over the surface of the at least one layer of dielectric at least one oxide crack check pattern is provided in a peripheral surface area of the substrate, and the at least one oxide crack check pattern is used for monitoring oxide cracks in the surface of the at least one layer of dielectric.

The via array pattern typically comprises metal, the metal can be aluminum or copper or tungsten or nickel or a compound thereof.

The oxide crack check pattern of the invention can be described as follows:

containing at least one first via array pattern being rectangular in shape, having a first side, via spacing of the first via array pattern being in accordance with a via minimum rule containing at least one second via array pattern being rectangular in shape, having a second side, via spacing of the second via array pattern being in accordance with a via minimum rule, and containing at least one metal line pattern being rectangular in shape having a third and fourth side, metal spacing of the metal line pattern being in accordance with a metal minimum rule, whereby the third and fourth side commonly share a point of intersection, the point of intersection being located on the first side of the first via array pattern, the first side of the first via array pattern coinciding with the third side of the metal line pattern, the point of intersection further being located on the second side of the second via array pattern, the second side of the second via array pattern coinciding with the fourth side of the metal line pattern.

Finally, the design rules of the invention can be summarized as follows:

spacing between two fully stacked adjacent via arrays is at least 10 μm via-to-via spacing in a fully stacked via array is at least 0.7 μm via array dimension in a fully stacked via array is at least 20×20 μm spacing between adjacent metal lines of interconnect metal is at least 10 μm, and concurrent with providing layers of metal lines, a fully stacked via array is provided.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of monitoring formation of oxide cracks in a layer of dielectric, comprising the steps of:
   providing a substrate, said substrate having been provided with semiconductor devices in or on the surface thereof;
   depositing at least one layer of dielectric over the surface of said substrate;
   creating at least one layer of via interconnects in said at least one layer of dielectric;
   creating at least one layer of top metal over the surface of said at least one layer of dielectric;
   providing at least one oxide crack check pattern in a peripheral surface area of said substrate; and
   using said at least one oxide crack check pattern for monitoring oxide cracks in the surface of said at least one layer of dielectric.

2. The method of claim 1, said at least one layer of dielectric comprising oxide.

3. The method of claim 1, said at least one oxide crack check pattern comprising:
   at least one first via array pattern being rectangular in shape, having a first side, via spacing of said first via array pattern being in accordance with a via minimum rule;
   at least one second via array pattern being rectangular in shape, having a second side, via spacing of said second via array pattern being in accordance with a via minimum rule;
   at least one metal line pattern being rectangular in shape having a third and fourth side, metal spacing of said metal line pattern being in accordance with a metal minimum rule, whereby said third and fourth side commonly share a point of intersection, said point of intersection being located on said first side of said first via array pattern, said first side of said first via array pattern coinciding with said third side of said metal line pattern, said point of intersection further being located on said second side of said second via array pattern, said second side of said second via array pattern coinciding with said fourth side of said metal line pattern.

4. The method of claim 1, said peripheral surface area of said substrate comprising a test-line of the substrate.

5. The method of claim 1, said at least one first via array pattern comprising stacked via arrays.

6. The method of claim 1, said at least one second via array pattern comprising stacked via arrays.

7. The method of claim 1, said at least one first via array pattern and said at least one second via array pattern and said at least one metal line pattern comprising a same level of metal.

8. The method of claim 1, said at least one first via array pattern comprising metal.

9. The method of claim 8, said metal being selected from the group consisting of aluminum and copper and tungsten and nickel and a compound thereof.

10. The method of claim 1, said at least one second via array pattern comprising metal.

11. The method of claim 10, said metal being selected from the group consisting of aluminum and copper and tungsten and nickel and a compound thereof.

12. A method for creating stacked vias in combination with interconnect metal, following the design rules of:
    spacing between two fully stacked adjacent via arrays being at least 10 μm;
    via-to-via spacing in a fully stacked via array being at least 0.7 μm;
    via array dimension in a fully stacked via array being at least 20×20 μm;
    spacing between adjacent metal lines of interconnect metal being at least 10 μm; and
    concurrent with providing layers of metal lines, a fully stacked via array being provided.

13. A method for creating stacked vias in combination with interconnect metal while monitoring formation of oxide cracks in a layer of dielectric, comprising the steps of:
    providing a substrate, said substrate having been provided with semiconductor devices in or on the surface thereof;
    depositing at least one layer of dielectric over the surface of said substrate;
    creating at least one layer of via interconnects following design rules in said at least one layer of dielectric, further creating at least one layer of top metal over the surface of said at least one layer of dielectric following said design rules;
    providing at least one oxide crack check pattern in a peripheral surface area of said substrate; and
    using said at least one oxide crack check pattern for monitoring oxide cracks in the surface of said at least one layer of dielectric.

14. The method of claim 13, said at least one layer of dielectric comprising oxide.

15. The method of claim 13, said at least one oxide crack check pattern comprising:
    at least one first via array pattern being rectangular in shape, having a first side, via spacing of said first via array pattern being in accordance with a via minimum rule;
    at least one second array via pattern being rectangular in shape, having a second side, via spacing of said second via array pattern being in accordance with a via minimum rule;
    at least one metal line pattern being rectangular in shape having a third and fourth side, metal spacing of said metal line pattern being in accordance with a metal minimum rule, whereby said third and fourth side commonly share a point of intersection, said point of intersection being located on said first side of said first via array pattern, said first side of said first via array pattern coinciding with said third side of said metal line pattern, said point of intersection further being located on said second side of said second via array pattern, said second side of said second via array pattern coinciding with said fourth side of said metal line pattern.

16. The method of claim 13, said peripheral surface area of said substrate comprising a test-line of the substrate.

17. The method of claim 13, said design rules comprising:
    spacing between two fully stacked adjacent via arrays being at least 10 μm;

via-to-via spacing in a fully stacked via array being at least 0.7 $\mu$m;

via array dimension in a fully stacked via array being at least 20×20 $\mu$m;

spacing between adjacent metal lines of interconnect metal being at least 10 $\mu$m; and concurrent with providing layers of metal lines, a fully stacked via array being provided.

18. The method of claim 15, said at least one first via array pattern comprising stacked via arrays.

19. The method of claim 15, said at least one second via array pattern comprising stacked via arrays.

20. The method of claim 14, said at least one first via array pattern and said at least one second via array pattern and said at least one metal line pattern comprising a same level of metal.

21. The method of claim 15, said at least one first via array pattern comprising metal.

22. The method of claim 21, said metal being selected from the group consisting of aluminum and copper and tungsten and nickel and a compound thereof.

23. The method of claim 15, said at least one second via array pattern comprising metal.

24. The method of claim 23, said metal being selected from the group consisting of aluminum and copper and tungsten and nickel and a compound thereof.

25. The method of claim 1, said at least one layer of dielectric comprising a low-k dielectric.

26. The method of claim 25, said low-k dielectric being selected from the group consisting of carbon doped silicates and spin-on low-k dielectric materials and polymeric materials.

27. The method of claim 26, said polymeric materials being selected from the group consisting of polyimides and fluorinated polyimides and polysilsequioxane and benzocyclobutene (BCB) and parlene F and parlene N and amorphous polytetrafluorothylene.

28. The method of claim 13, said at least one layer of dielectric comprising a low-k dielectric.

29. The method of claim 28, said low-k dielectric being selected from the group consisting of carbon doped silicates and spin-on low-k dielectric materials and polymeric materials.

30. The method of claim 29, said polymeric materials being selected from the group consisting of polyimides and fluorinated polyimides and polysilsequioxane and benzocyclobutene (BCB) and parlene F and parlene N and amorphous polytetrafluorothylene.

* * * * *